Figure 1A:
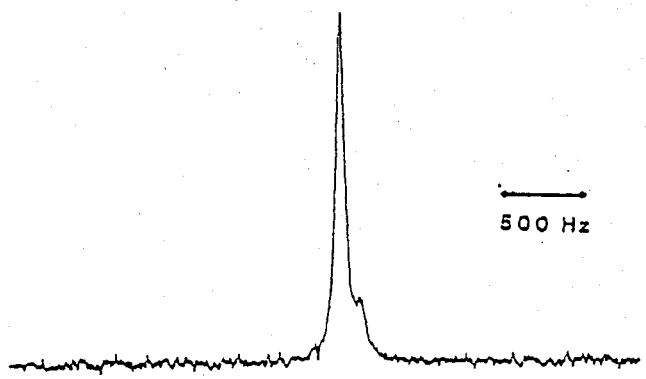

United States Patent [19]

Doddrell et al.

[11] Patent Number: 4,889,125

[45] Date of Patent: Dec. 26, 1989

[54] METHOD FOR THE DETERMINATION OF IRON STORES IN ORGANIC TISSUE AND NMR SPECTROMETER FOR PERFORMING THIS METHOD

[76] Inventors: David M. Doddrell, 6 Luzerne, West Lake, Brisbane, Australia; Michael G. Irving, 18 Henzell Terrace, Greenslopes, Brisbane, Australia, 4120

[21] Appl. No.: 58,954

[22] Filed: Jun. 5, 1987

[30] Foreign Application Priority Data

Jun. 9, 1986 [EP] European Pat. Off. ...... 86 107 833.5

[51] Int. Cl.⁴ .................................................. A61B 5/04
[52] U.S. Cl. ...................................... 128/653; 324/307
[58] Field of Search ........................ 128/653; 436/173; 324/307, 309, 300, 312, 318

[56] References Cited

U.S. PATENT DOCUMENTS

| | | | |
|---|---|---|---|
| 3,702,831 | 11/1972 | Chiarelli et al. ..................... | 436/173 |
| 4,362,993 | 12/1982 | Young et al. ........................ | 324/309 |
| 4,636,730 | 1/1987 | Bottomley ........................... | 328/318 |
| 4,675,173 | 6/1987 | Widder ................................ | 436/173 |

OTHER PUBLICATIONS

Beall, P. T. et al., "NMR Data Handbook for Biomedical Applications", Pergamon Press, N.Y., 1984, pp. XIV, 6 (copy AU335).
"NMR Data Handbook for Biomedical Applications", Beall et al., 1984, pp. 43, 59, 90, 144.
M. A. Foster: Magnetic Resonance in Medicine and Biology, pp. 137 to 143, Pergamon Press, Oxford, Great Britain.

*Primary Examiner*—3
*Assistant Examiner*—Francis Jaworski
*Attorney, Agent, or Firm*—Pennie & Edmonds

[57] ABSTRACT

A method for the determination of iron stores in organic tissue consists in measuring the relaxation time of deuterium included in said tissue by magnetic resonance spectroscopy.

3 Claims, 6 Drawing Sheets

METHOD FOR THE DETERMINATION OF IRON STORES IN ORGANIC TISSUE AND NMR SPECTROMETER FOR PERFORMING THIS METHOD

The invention refers to a method for the determination of iron stores in organic tissue.

Up to now, a simple method for the direct measurement of tissue iron stores is not available, although there is a need for such a method. E.g., the lack of such a method has long hampered the clinical investigation of iron metabolism in man. Measurement of the serum ferritin concentrations has been useful in the diagnosis of clinically manifested hemochromatosis and in the detection of hemochromatosis in asymptomatic relatives (PRIETO, J., BARRY. M. and SHERLOCK, S., Gasterenterology 68, 525-533 (1975), and HALLIDAY. J. W., COWLISHAW, J. C., RUSSO, A. M. et al, Lancet 1, 621-624 (1977). However, serum ferritin has been reported to be within normal limits in some families with primary hemochromatosis and is elevated in other conditions in the absence of excess body iron including liver disease. Transferrin saturation has been reported to be no more predictive of tissue iron content than serum ferritin estimations (HALLIDAY, J. W. and POWELL, L. W., Seminars in Haematology 19, 42–53 (1982). Liver biopsy is the definitive test for the confirmation of increased iron stores, however, the morbidity of this procedure limits its use for repetitive studies of asymptomatic relatives and patients who are being assessed for disturbances in iron metabolism. Therefore, it is the object of the invention to provide a method which allows an accurate measurement of tissue iron stores without impairing the tissue storing the iron.

This object is met by the invention which consists in that the relaxation time of the deuterium included in said tissue is measured by magnetic resonance spectroscopy.

Between 50-80% of organic tissues is water, which corresponds to a water concentration in excess of 40 Mol/l. The corresponding deuterium concentration of HOD (Monodeuterated water) in natural abundance is thus in excess of 12 mMol/l. Even allowing for an approximately 30-fold reduction in the sensitivity of detection by MRS because of the lower gyromagnetic ratio of $^2H$ compared to $^1H$ and its low natural abundance (0.015%), natural abundance deuterium signals in organic tissue may be detected. Furthermore, because $^2H$ $T_1$ values are short ($T_1 > 300$ ms), short pulse repetition times are possible and the effective signal to noise ratio achieved in a given time will be far better than that obtained from either $^{31}P$ or $^{13}C$ nuclei. Therefore, the use of natural abundance deuterium ($^2H$) magnetic resonance spectroscopy (MRS) is an appropriate means for non-invasively assessing body iron stores in organic tissue and even in vivo.

The method allows the composition of tables relating $^2H$ relaxation times to different iron store levels of specific tissues so that a measured $^2H$ relaxation time is an immediate indication of the iron stored in the investigated tissue. Since the $^2H$ relaxation times depend on the kind of the tissue under investigation, it is of advantage to limit the measurement to tissue region of interest. This may be done by means of surface coils or by the application of common volume selective pulse experiments (see for example J. Magn. Reson. 56, 350 (1984) and 59, 338 (1984)).

As indicated before, the natural abundance of deuterium is sufficient to produce signals allowing the determination of iron stores. However, the sensitivity of the new method may be increased by artificially increasing over the natural abundance the deuterium contents of the tissue to be investigated, e.g. by introducing heavy water (HOD) into the tissue under investigation. Heavy water may be applied to animals and plants by watering them with water having an increased HOD-content.

The new method may be performed with nearly any modern NMR spectrometer which includes an RF pulse transmitter for generating HF pulse sequences allowing the excitation of deuterium spins in the tissue under investigation, and receiving means for receiving and analyzing the spin resonance signals for the relaxation times. If the measurement is to be limited to a specific volume, the spectrometer may comprise gradient field generating and switching means for performing volume selective pulse experiments. A very simple means for volume selection, however, is the use of spectrometer having a surface coil which is tuned to the spin frequency of deuterium included in the tissue which is exposed to the homogeneous static magnetic field produced by the magnet of the NMR spectrometer.

Figure 1B:
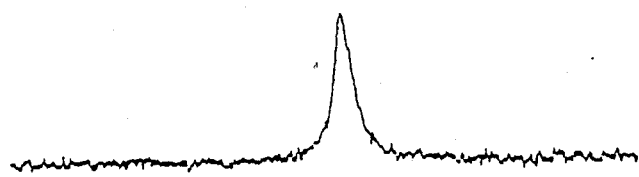
Figure 1C:
Figure 2A:
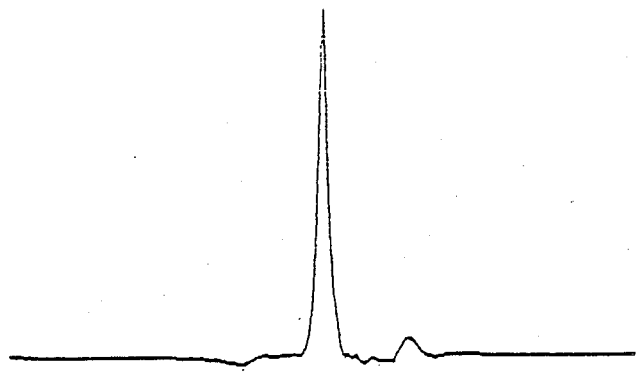
Figure 2B:
Figure 3:
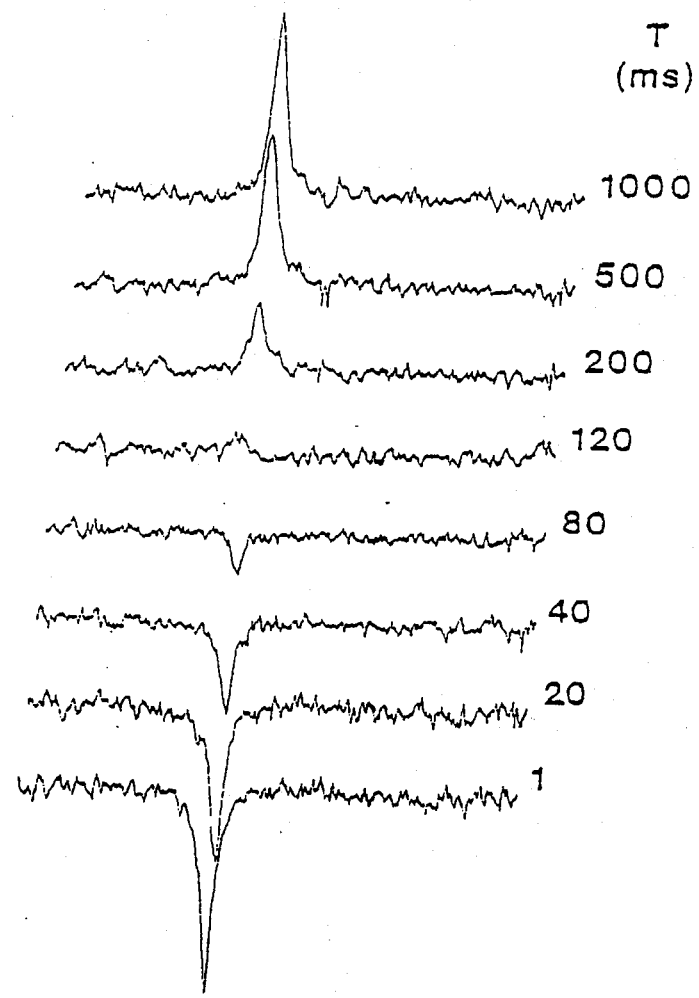

The present invention may be more readily understood with reference to the following detailed description of experiments performed according to the invention and to the accompanying drawings which illustrate the results of said experiments. In the drawings:

FIGS. 1(a), 1(b) and 1(c), respectively, shows natural abundance 30.7 MHz $^2H$ NMR spectra of the abdomen of a mouse after (a) 0, (b) 5 and (c) 7 days feeding on a 1% carbonyl iron diet, FIGS. 2(a) and 2(b), respectively, show 200 MHz $^1H$ NMR spectra of a mouse after (a) 0 and (b) 7 days feeding on a carbonyl iron diet, having one percent weight carbonyl iron per unit body weight and FIG. 3 shows $^2H$ NMR spectra of the abdomen of a mouse as a function of the delay time, $\tau$, in the $T_1$ inversion recovery sequence $\pi[x] - \tau - \pi/2[x, \pm]$, rec.$\pm$., where "$\pi/2[x, \pm]$" designates a $\pi/2$ pulse applied alternatively in the $+x$ and $-x$ directions and "rec.$\pm$." designates recording alternate received signals alternately by addition and subtraction after 6 days feeding on a 1% (w/w) carbonyl iron diet having one percent by weight carbonyl iron per unit body weight.

Experiments were performed on an extensively modified Bruker NMR spectrometer using an ASPECT-2000 computer and a CXP modulator and pulse programmer. The spectrometer included a superconducting OXFORD magnet which had a bore of 130 mm with a free bore of 110 mm diameter and operated at 4.7 T. A probe using a horizontal solenoid coil of 1.5 cm width was tuned to the $^2H$ excitation frequency. Female Quackenbush mice (30–40 g body weight) were anaesthetised (Ketamine, 100 mg/kg and Diazepam 3 mg/kg body weight, intraperitoneally) and positioned within the coil around the upper abdomen, approximately at the level of the liver. The temperature of the probe was maintained at 30±2° C. and air at a flow rate of 10 ml/s was supplied to animals in the probe to prevent hypoxia. Because of heating from the shims this probe temperature and airflow maintained the body temperature of mice at 35° C. Spectra were Fourier transformations of the accumulations of 1000 free induction decays arising from 90° pulses of 50 μs duration with a recycle time of 0.5 s. Mice were fed diet containing 1% carbonyl iron which induces marked deposition or iron in hepatocytes with little toxic damage to the liver.

FIG. 1a shows the in vivo whole body $^2$H spectra of mice recorded at 30.7 MHz. Spectra with a high signal/noise ratio were obtained with acquisition times as short as 0.3 s. As indicated above, the spectra are Fourier transformations of the accumulation of 1000 free induction decays arising from 90° pulses of 50 μs duration with a recycle time of 0.5 s. In addition to the dominating signal arising from HOD, a smaller peak corresponding to the —CHD— groups of body fat appears on the low frequency side of the dominating signal. This spectrum was obtained in 8 min.

Tissue characterization by magnetic resonance imaging is based primarily upon differences in longitudinal ($T_1$) and transverse ($T_2$) relaxation times of tissues. As explained by STARK, D. D., MOSELEY, M. E., BACON, B. R. et al. in Radiology 154, 137-142 (1985), iron overload in organic tissues results in marked decrease in $T_1$ values due to paramagnetic enhancement of longitudinal relaxation (DOYLE, F. H., PENNOCK, J. M., BANKS, L. M. et al., Amer. J. Radiol. 138, 193-200 (1982)). As paramagnetic iron (most likely Fe(III), high-spin $d^5$) is complexed in the tissue, the relaxation times are modified. The observed $T_1$ value will be a weighted average of the $T_1$ values of the free HOD molecules, $T_{1f}$, and the iron bound HOD molecules, $T_{1b}$, i.e.

$$\frac{1}{T_1} = \frac{(1-x)}{T_{1f}} + \frac{x}{T_{1b}}$$

where x represents the proportion of HOD molecules in contact with iron. A similar relationship holds for the observed $T_2$ value. Since the line broadening is largely dominated by the paramagnetic iron, the $1/T_{2f}$ term may be neglected, and if x is expressed in terms of the total iron concentration, N, the coordination number, n, and the molar concentration of deuterium, $N_D$ then $$\frac{1}{T_1} = \frac{N}{N_D} \frac{n}{T_{1b}}$$

Thus, the decrease in $T_1$ and $T_2$ values of deuterium resonance is indicative of the iron concentration.

The $^1$H spectra of $H_2O$ in vivo following iron-loading is shown in FIG. 2. Four scans were accumulated into a 1024 point data base with a spectral width of (a) 1000 Hz and (b) 10000 Hz. The vertical scale of spectrum (b) has been magnified 120 times that of spectrum (a). The spectra were obtained with the same probe as described for FIG. 1. As shown, massive line broadening occurred for $^1$H—$H_2O$ in vivo which made determination of $T_1$ or $T_2$ values impossible. $^{31}$P spectra (data not shown) also resulted in similar line broadening indicating that this nuclei could not be employed for the determination of in vivo iron stores. The data in FIG. 1b and 1c show the deuterium spectra after 5 and 7 days of iron feeding. Because the paramagnetic contribution to relaxation times ($T_1$ or $T_2$) is of the form $$(1/T_i,\ i=1\ or\ 2)\ \alpha \gamma_e^2 \gamma_k^2,\ k = {}^1H\ or\ {}^2H$$

and $\gamma_e$ is the gyromagnetic ratio of the electron, the line broadening will be a factor of 42 less for $^2$H compared to $^1$H.

Because the line broadening is less than that observed with $^1$H and $^{31}$P, $T_1$ and $T_2$ values can be determined at much higher concentrations of iron before the spectra become too broad to be useful. $^2$H $T_1$ values were determined by the inversion recovery procedure using the $\pi[x]-\tau-\pi/2[x\pm]$, rec.$\pm$, pulse sequence where $\tau$ was varied from 2 to 1000 ms with a recycle time of 1.5 s and a $\pi/2$ pulse time of 50 μs. $^2$H $T_1$ values for HOD in vivo decreased from 228±5 to 169±5 over 6 days, as shown in FIG. 3 which was obtained by acquiring 300 scans per spectrum using a recycle time of 1 s. and a spectral width of 5000 Hz. This represented an increase in hepatic iron concentration of 3±1 μmoles/g dry wt to 14.9±3.6 μmoles/g dry wt and a total body iron concentration of 115±27 μmoles/g dry wt. Subsequent studies have shown that measurement of $^2$H $T_1$ values after elimination of dietary iron reflects almost exclusively hepatic iron deposits. Previous studies made by BOOTH, C. J., DAVIS, C. K. C. and IRVING, M. G. and published in Proc. Aust. Biochem. Soc. 17, 96 (1985) shown that 1% carbonyl iron in the diet results primarily in hepatic deposition of iron, predominately with a parenchymal distribution such as is seen in primary hemochromatosis. The data presented here clearly demonstrates that natural abundance $^2$H MRS has distinct advantages over spectroscopy of other nuclei and may be ideally suited to evaluating total body iron stores in organic tissue and even in man in vivo.

Although the invention may also be used advantageously in the study of iron metabolism in man, it is a general method means for the determination of iron stores in all organic tisues which include a sufficient amount of water. Thus, it can be used in all fields of biologie, agriculture, stock farming, food industry, etc. where the iron content of organic and especially living tissue is of interest.

We claim:

1. Method for the determination of iron stores in organic tissue, comprising measuring a nuclear magnetic resonance relaxation time of deuterium included in said tissue by magnetic resonance spectroscopy and relating the measured deuterium relaxation time to a level of iron stores for said tissue.

2. Method according to claim 1, wherein the measurement is substantially limited to tissue regions of interest.

3. Method according to claim 1, wherein the deuterium contents of the tissue to be investigated is artificially increased over natural abundance.

* * * * *